US012638499B2

(12) United States Patent
Chornenky et al.

(10) Patent No.: US 12,638,499 B2
(45) Date of Patent: May 26, 2026

(54) TESTING OF MICROELECTRONICS DEVICE AND METHOD

(71) Applicant: NOKOMIS, INC., Canonsburg, PA (US)

(72) Inventors: Todd Eric Chornenky, Carmichaels, PA (US); James Robert Uplinger, II, Cranberry Township, PA (US); Andrew Richard Portune, Oakdale, PA (US); Walter J. Keller, III, Bridgeville, PA (US)

(73) Assignee: Nokomis, Inc., Canonsburg, PA (US)

( * ) Notice: Subject to any disclaimer, the term of this patent is extended or adjusted under 35 U.S.C. 154(b) by 0 days.

(21) Appl. No.: 18/418,289

(22) Filed: Jan. 21, 2024

(65) Prior Publication Data

US 2024/0410940 A1      Dec. 12, 2024

Related U.S. Application Data

(62) Division of application No. 17/032,719, filed on Sep. 25, 2020, now Pat. No. 11,879,935.

(51) Int. Cl.
G01R 31/312 (2006.01)

(52) U.S. Cl.
CPC ................................. G01R 31/312 (2013.01)

(58) Field of Classification Search
CPC ..................................................... G01R 31/312
USPC ..................................................... 324/754.28
See application file for complete search history.

(56) References Cited

U.S. PATENT DOCUMENTS

| | | | | | |
|---|---|---|---|---|---|
| 4,613,924 | A | * | 9/1986 | Brault .................... | H05K 1/112 |
| | | | | | 361/767 |
| 5,309,110 | A | * | 5/1994 | O'Neill ............. | G01R 27/2641 |
| | | | | | 324/681 |
| 5,367,253 | A | * | 11/1994 | Wood ................. | G01R 31/2893 |
| | | | | | 324/750.05 |
| 5,969,530 | A | * | 10/1999 | Yamashita ......... | G01R 31/2805 |
| | | | | | 324/754.28 |
| 5,997,314 | A | * | 12/1999 | Wallace ................. | H01R 24/50 |
| | | | | | 343/703 |
| 2006/0250245 | A1 | * | 11/2006 | Forster ................. | G01R 31/312 |
| | | | | | 340/572.1 |

FOREIGN PATENT DOCUMENTS

EP        0596773  A1  *  10/1993   ........... G01R 31/312

OTHER PUBLICATIONS

Cachier; Translation of EP0596773A1; Pub. Date Oct. 26, 1993; Translated by Clarivate (Year: 1993).*

* cited by examiner

*Primary Examiner* — Alesa Allgood
*Assistant Examiner* — Rahul Maini
(74) *Attorney, Agent, or Firm* — AP Patents; Alexander Pokot

(57)        ABSTRACT

A device and method to test microelectronic parts to determine whether the parts are compromised by active illumination in a testing fixture by analysis of emission metrics.

15 Claims, 8 Drawing Sheets

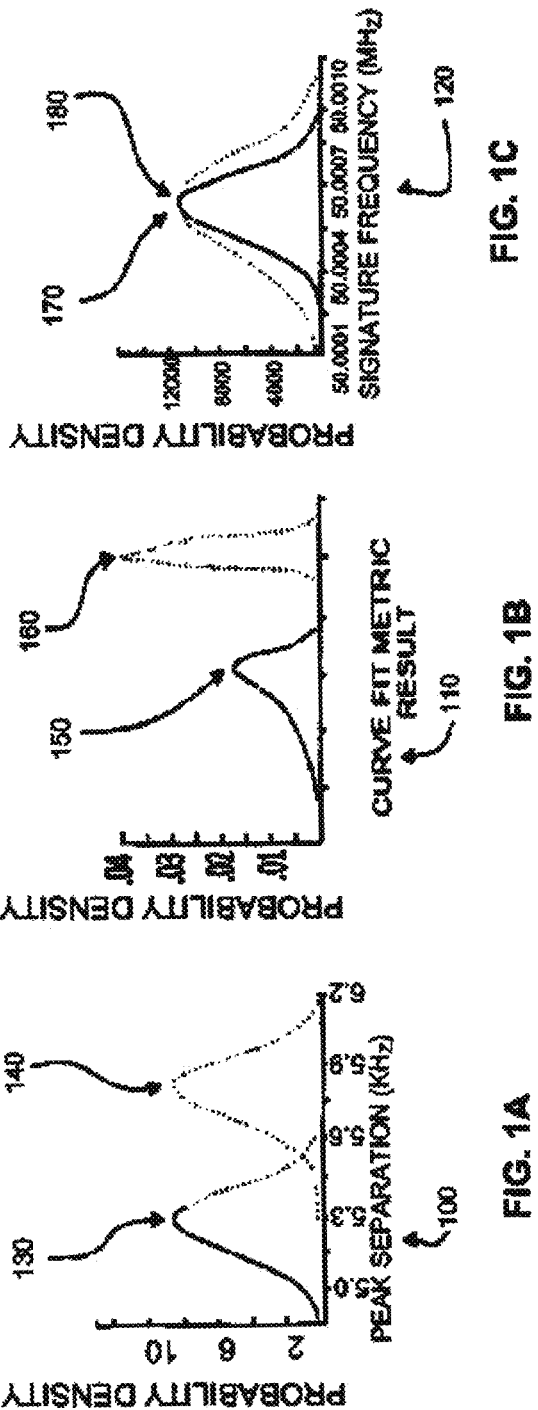

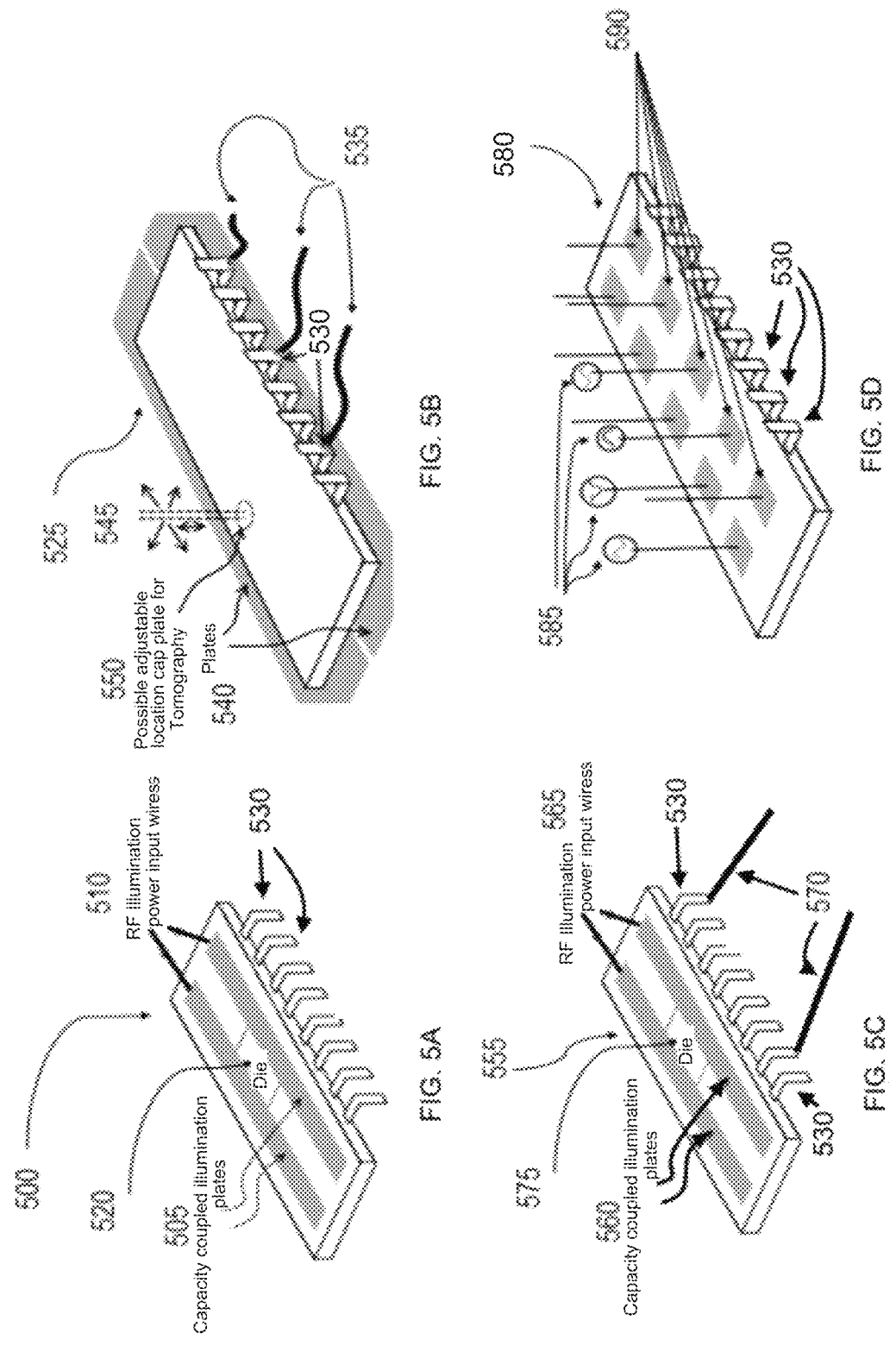

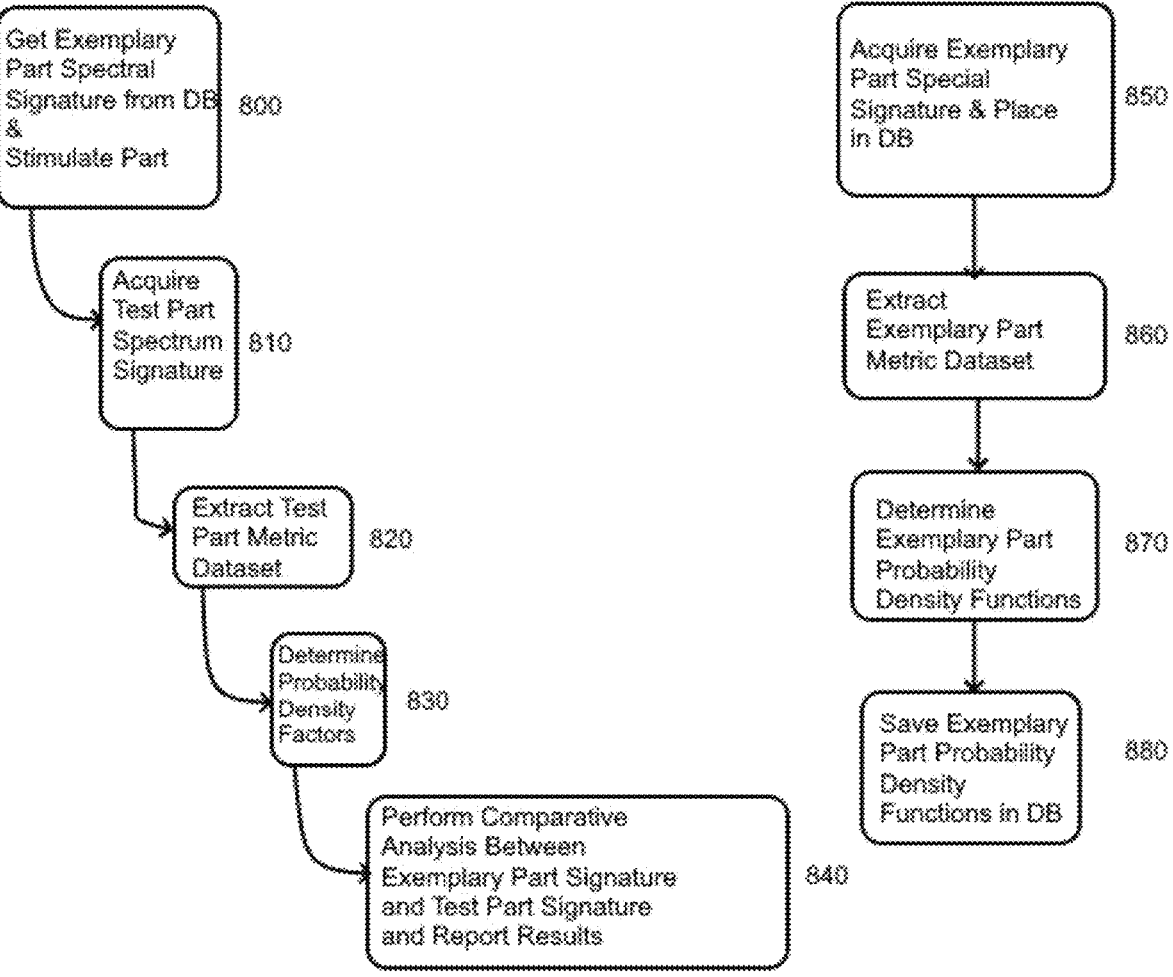
FIG. 8A                   FIG. 8B

TESTING OF MICROELECTRONICS DEVICE AND METHOD

REFERENCE TO SEQUENCE LISTING, A TABLE, OR A COMPUTER PROGRAM LISTING COMPACT DISC APPENDIX

N/A

BACKGROUND OF INVENTION

The detection of counterfeit and trojan microelectronics have been performed through methods such as Radio Frequency (RF) emission analysis, electric current analysis, x-ray analysis, and visual inspection. Such methods can be readily used to determine overall authenticity or functionality of the device, but for devices that are authentic that have been manufactured on the limits of performance specification, have been degraded through environmental conditions, or have been reused, these methods have previously not been adequate to identify potential performance issues.

BRIEF SUMMARY OF INVENTION

The technical problem is to fully assess and characterize a microelectronic device Part Specimen Under Test (PSUT) to determine authenticity, whether it has been compromised, and its reliability. An example, without intending to limit the types and varieties of microelectronic devices, of a PSUT may be a 74HC04 Hex Inverter in a 14-lead PDIP package 0.300" pin to pin wide, 0.250" package width by about 0.750" package length. Another example may be a Microchip Technology AT27C512R-45PU 0.600" pin to pin wide, EPROM Memory IC 28-PDIP 13.5 mm package width×37 mm package length. Another example may be a MAXIM ICM7218BIQI+ LED Driver 28-PLCC (11.51"×11.51"). As used in this application the specimen is meant to include not only the type or model that the part is designated, but also the specific specimen of such part designation. This application describes and claims a microelectronic PSUT assessment device and method with far more convenience to the operator, speed and ease of PSUT placement or replacement than conventional testing. The device of this application typically requires no specialized connecting intermediate apparatus such as a unique precisely manufactured custom fixture for a PSUT. It also requires no direct pin-to-metal electrical contact with the PSUT. By using active illumination as a PSUT stimulus source, it is possible to energize the PSUT without connecting the PSUT to a manufactured custom fixture. Such a connection is typically time-consuming. The generalized fixture of this application may be used with a diverse range of part packages and pin layout. A further advantage is that the fixture does not require an exact pin socket configuration, voltages, currents, or clock inputs at specific pins as configured in a hardware board specific to a PSUT. The time from physical receipt of the PSUT, test setup, and actual test time of the PSUT may be reduced, by a factor of 10× to 100×.

The invention addresses how RF emissions from microelectronic parts and devices can be analyzed for nonconformance to deduce the reliability of the device specimen, using a novel apparatus and methods to energize the microelectronic PSUT.

The device energizes the microelectronic PSUT indirectly by inducing an electrical current in the microelectronic PSUT by capacitive coupling. Capacitive coupling is accomplished with a capacitive member, preferably two capacitive plates also known as illumination plates that serve as an RF illuminator. The capacitive plates are connected to an RF source and power amplifier that establishes a dynamic electrical field. The varying electrical field then induces a current in the device.

The device has a test fixture in the preferred embodiment that has two or more layers. The first layer has the capacitive plates that are registered at a predetermined spacing from each other. The second layer positioned above the first layer has a cavity to receive the PSUT. The cavity positions the PSUT at a predetermined distance from the capacitive plates.

The test fixture is placed within the interior of an RF isolating enclosure with an integrated antenna to acquire unintended electromagnetic emissions due nearly exclusively to the energized PSUT. The shielded enclosure reduces RF electrical noise from external electronic sources.

A transmission chain is connected to the capacitive plates. The transmission chain has a function generator, signal generator, and RF amplifier that provides the RF power and controls the frequency of RF power to the capacitive plates.

The integrated antenna is connected to a signal analyzer or analysis unit. The signal analyzer serves two functions. It records the spectra of genuine non-compromised PSUTs to enable the determination of emission signature metrics. The signature metrics include spectral analysis measurements including, but not limited to the spectrum dB as a function of frequency profile, curve fit, cross modulation frequency peak analysis, amplitude at frequency position, RF peak shape, spacing between RF features, relative frequency or amplitude position, harmonics frequency dB height, existence or nonexistence of spectral signatures, and non-harmonically related RF peaks. The RF signature metrics are stored on a memory unit as signature database files.

Preferably, 12 or more multiple frequency regions are analyzed. The signal analyzer has at least one channel, but is preferably is multi-channel to acquire spectral data more rapidly. In different embodiments the signal analyzer has 2, to 16 channels. The number of channels is typically a multiple of 2. The spectral acquisition analysis can be done from an individual channel, a combination of channels, or all of the channels contemporaneously.

The acquisition of unintended emissions of a PSUT can be repeated multiple times. The testing can be run for a predetermined number of repetitions or for a predetermined time period. The total spectral data gathered can be analyzed in a reasonable time. Similarly, the analysis can be over finite separated predetermined regions or analyzed over a single ultra-wide band typically spanning over 80 MHz. The use of multiple runs can be averaged such as non-coherent integration in the frequency domain to increase the signal to noise ratio of spectral signature elements.

The baseline representative signature of RF metrics of a known exemplary PSUT, or group of exemplary parts, is used in the analysis of the PSUT. The signature database containing representative signatures is used to define parameters for algorithmic analysis of the emission spectra of the PSUT. The algorithm parameters allow for identification of a non-conforming test spectrum of a PSUT. The algorithms are described in more detail in the detailed description of the invention.

The signature analyzer may assess the authenticity, Remaining Useful Life (RUL), and reliability of microelectronic devices utilizing collected RF emissions from the device. Authenticity is validated by algorithmic analysis of emission signature features that are compared to known features of one or more authentic device specimens previously determined by utilizing manual or automated analysis routines. Reliability of the device specimen will be determined by confirming that one or more of the emission signatures substantially matches the expected emission signature within a preestablished range through signature metric analysis of the device specimen.

Energizing of the microelectronic PSUT or device by capacitive coupling to its internal electronics, conductive traces, and conductors induces electrical signals such as RF currents and then evokes corresponding emission features. This produces spectral emissions without the direct electrical connection used in traditional energizing methods. This offers far more convenience to the operator and typically requires no specialized connecting intermediate apparatus such as a unique precisely manufactured custom fixture for a part. In certain embodiments this is the preferred method to generate emission content that can be analyzed for greater analysis assurance.

BRIEF DESCRIPTION OF DRAWINGS

FIG. 1A is a graph illustrating the spectrum feature of peak separation.

FIG. 1B is a graph illustrating the spectrum feature of separation distance.

FIG. 1C is a graph illustrating the signature frequencies.

FIG. 5A a perspective view of test fixture with the device specimen having a pin wired as an output to generate spectra to be evaluated.

FIG. 5B is a perspective view of the test fixture with adjustable location capacitive coupled plate for illumination and/or spectral emission capture.

FIG. 5C is a perspective view of the test fixture with the PSUT having a die and clock power and ground attached to pins, said PSUT emitting RF spectral features.

FIG. 5D is a perspective view of the test fixture with multiple capacitive plates to illuminate multiple regions of the PSUT.

FIG. 8A is a diagram of the method for analyzing emissions.

FIG. 8B is a diagram of the method for creating exemplary probability density functions.

DETAILED DESCRIPTION OF INVENTION

Figures 2A, 2B:
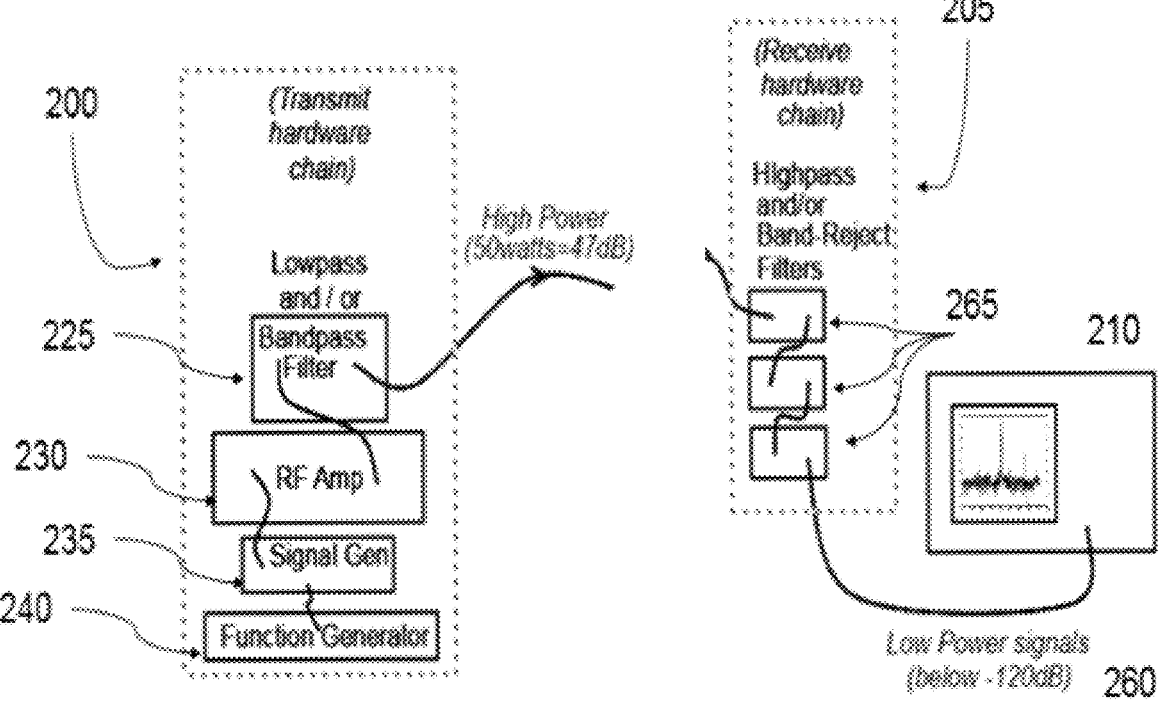
FIGS. 2A-2B illustrate a block diagrams of an active illumination system using illumination from an antenna.

The following detailed description is merely exemplary in nature and is not intended to limit the claimed invention to the described examples or uses of the described examples. As used herein, the words "example" or "illustrative" means "serving as an example, instance, or illustration." The implementations described below are implementations provided to enable persons skilled in the art to make or use the embodiments of the disclosure and are not intended to limit the scope of the disclosure or claims. For purposes of the description herein, the terms "upper", "lower", "left", "rear", "right", "front", "vertical", "horizontal", "exterior", "interior", and derivatives thereof shall relate to the invention as oriented in the Figures.

Furthermore, there is no intention to be bound by any expressed or implied theory presented in the preceding technical field, background, or the following detailed description. It is also to be understood that the specific devices and processes illustrated in the attached drawings, and described in the following specification, are simply examples of the inventive concepts defined in the appended claims. Hence specific dimensions and other physical characteristics relating to the examples disclosed herein are not to be considered as limiting, unless the claims expressly state otherwise.

The terms and words used in the following description and claims are not limited to the bibliographical meanings, but, are merely used by the applicant to enable a clear and consistent understanding of the inventions. Accordingly, it should be apparent to those skilled in the art that the following description of exemplary embodiments of the invention are provided for illustration purposes only and not for the purpose of limiting the invention as defined by the appended claims and their equivalents.

It is to be understood that the singular forms "a", "an", and "the" includes the plural unless the context clearly dictates otherwise. Thus, for example, reference to "a circuit board" includes reference to one or more of such circuit board.

It is to be understood that a compromised or modified device specimen, PSUT, or microelectronic refers to a device specimen which has been modified to have reduced functionality, has been aged, offers reduced reliability for its intended use, or has been modified for functionality other than the original manufacturer's intended use of the device. A compromised or modified device specimen also includes counterfeit devices that may not function according to the original manufacturer's intended use or specified operational ranges such as temperature, voltage, power dissipation, or frequency ranges.

It is to be understood that an unmodified PSUT, or microelectronic part includes a part specimen that has not been modified from its original manufacturer's intent in bit, byte, or word patterns in software, firmware, or programmable hardware, or by other changes such as Focused Ion Beam (FIB) circuit editing to alter the devices' functionality. It also has not been substantially aged beyond the expectations of the user. Unmodified also means uncompromised.

The forgoing description will be focused on emission of unintended electromagnetic energy and, more particularly, the emission of unintended electromagnetic energy being in a RF spectrum, which is typically referred to in the art as frequencies below 300 GHz, although infrared, infrasonic and other emissions are also contemplated by the exemplary embodiments. They are unintended in the sense that the manufacturer and designer did not intentionally design the device to create those emissions and had not originally intended to use those emissions. They are derived as unintentional, harmless artifacts of the design and manufacture process.

It is to be understood that an unintended electromagnetic emission signature, RF signature, spectral signature element, spectral signature, signature element, RF emission signature, or emission signature refers to the frequency domain spectral features that are used herein to uniquely identify the hardware and/or software configuration of a device. An emission signature is comprised of one or more signature elements that each having one or more of a frequency position, amplitude, phase, and/or shape.

It is to be understood that non-linear attachments, non-linear mixing products, or side-band features are comprised of the one or more frequency domain spectral signature representations of frequency mixing products on a carrier frequency. Non-linear attachments can be symmetrically or asymmetrically distributed around a central emission signature, with greater or lesser amplitude than the central emission signature.

It is to be understood that a non-harmonically related signature element is one or more signature elements that originates from a different process, computation, electronic component, or subcomponent than a reference signature element. The relationship between two non-harmonically related signature elements can be quantified by one or more of frequency separation, amplitude, and/or shape.

It is to be understood that an emission signature metric, signature metric, or metric refers to the results of algorithms used to uniquely identify RF spectral emission signature features. An emission signature includes, but is not limited to, the absolute frequency of the signature element, the shape of a signature element, the frequency spacing between signature elements, the Bessel parameters of non-linear attachments to a signature element, the shape of an envelope formed by non-linear attachments to a signature element, the number of signature elements, and/or the number of non-linear attachments to a signature element. A typical signature element may be characteristic of one or more spectral peaks within a spectrum, said spectral peak or peaks with associated frequencies, dB levels, shape, or phase noise characteristics. Also, a typical signature element may have characteristics of one or more spectral peaks within a spectrum, said spectral peak or peaks with associated frequencies, dB levels, shape, or phase noise characteristics.

It is to be understood that active illumination, illumination, and RF illumination refers to electromagnetic energy directed at a device specimen from an antenna, and/or capacitive plates. The directed electromagnetic energy is used to energize the PSUT to eliciting an electromagnetic emission having an RF emission signature.

It is to be understood that a signature database is a collection of files, lists, or instructions that are unique to specific microelectronic parts, devices, and/or components. A signature database file, signature file, or metric file contains instructions for one or more of specific frequencies, frequency ranges, Resolution Band Widths (RBWs), algorithms, algorithm parameters, signal processing parameters, analysis processing instructions for a unique part in order to perform signature metric analysis on unintended RF emissions, and/or probability density functions (PDFs) of one or more exemplary PSUTs. A signature file contains the information needed to acquire spectral emissions that can be used to uniquely identify the part or device using signal processing and algorithmic solutions to quantify and compare emission spectra from a PSUT to one or more exemplary PSUTs or devices.

It is to be understood that an algorithmic solution, or algorithmic analysis is the result from an algorithm that has been processed for a spectral emission signature based on specified algorithm, algorithm parameters, and/or signal processing parameters. An algorithmic solution is unique to a specified signature metric for a defined spectral emission signature in a specified frequency region of interest.

The emphasis of microelectronic analysis has been on determining the authenticity of the device specimen, with no emphasis on the determination of how well an authentic device will function. The technical problem is to take emission spectral measurements and provide relative reliability assessments of device specimens that have been in long term storage, reworked by the manufacture, salvaged from other boards, used under out-of-manufacturer-specified conditions, or reused from other applications. The technical solution is to repeatedly acquire emissions spectra, analyze the distribution of quantitative metrics of the spectral features, and compare the distributions to those of known reliable components. The emission spectra will be generated, measured, and analyzed in a complete system described herein.

The system acquires valuable characteristic features embedded in parts such as integrated circuits' and other microelectronics' unintended RF emissions. By examining the unintended emissions, it is possible to identify PSUTs that are counterfeit, damaged, aged extensively, compromised, or operating out of the manufacturer's specified performance. PSUTs can also be compromised by physical-cyber and cyber-attacks. By using active illumination, it is possible to energize the PSUTs without connecting the PSUT to an assembly or subassembly.

Connecting the PSUT is typically time-consuming. A more general engagement permits covering a diverse range of parts package and pin physical construction may be made without requiring the exact pin socket configuration, voltages, and currents at specific pins to be configured in a hardware board that is specific to the PSUT. Energizing the PSUT without connecting it allows for examination of physical or cyber exploits and other compromises in the PSUT that remain dormant during nominal operational conditions. Trojan, cloaked, or dormant cyber exploits are more difficult to discover than the physical anomalies in a connected PSUT.

Capacitive plates are used to stimulate the PSUT, contacting the non-conducting chip top parallel to the plates' surface. The capacitive plates establish an electrical field that induces a current in the conductors within the die, the circuit components, or the conductive interconnects.

Turning to FIG. 1A, Graph 100 illustrates the peak separation probability distribution of an exemplary uncompromised device 130 and the peak separation probability distribution of a compromised device 140 specimen with a graph of peak frequency separation versus their respective probability density functions. The probability density function metric units are shown on the Y-axis in relative terms of reference. FIG. 1B is a graph 110 illustration of the probability density function metric of the curve fit results comparison between the uncompromised part 160 and compromised PSUT 150. FIG. 1C illustrates a graph 120 with an exemplary device's signature element frequency position measurement of the nominal 50 MHz signature element 170 result and PSUT's signature element frequency position measurement of the nominal 50 MHz signature element 180 versus their respective probability density function results. These illustrate the probability density versus various possible signature metrics. In probability theory, a probability density function (PDF), or density of a continuous random variable, is a function whose value at any given sample (or point) in the sample space (the set of possible values taken by the random variable) can be interpreted as providing a relative likelihood that the value of the random variable would equal that sample. The PDF provides a useful method of distinguishing distributions of signals. Here the peaks of the emissions are evoked by active illumination. The measurements illustrated are not limiting to the types of measurements that can be used in the described analysis.

FIG. 2 is a diagram detailing an embodiment of the RF filters in an active illumination system used to illuminate the PSUT. Reference 200 is the transmit chain. The transmit chain 200 has a function generator 240 connected to a signal generator 235. The function generator 240 connected to a signal generator 235 may be comprised in a single unit such as a pre-configured Arbitrary Waveform Generator. The signal generator 235 is connected to a RF amplifier 230 which is connected to one or more filters 225. Depending on the application, the filters 225 can be a band pass filter, a low pass filter or a combination of the band pass and low pass filters. Typically, the filter passes the fundamental frequency and rejects the higher harmonic frequencies. A bandpass filter may be used to only pass the fundamental frequency, rejecting both higher harmonics and sub-harmonics.

Typically, the component or IC specimen responds to the fundamental RF illumination frequency with unintended emission RF peak features around the $3^{rd}$ and $5^{th}$ harmonic. The RF Filter 225 and 265 reduces the emission of harmonics generated within the RF amp 230 or signal generator 235 from propagating emission artifacts into the analysis unit 210 and overwhelming or being mistaken for the desired unintentional emissions from the component or IC PSUT which are typically within the same frequency range. The RF Filter 225 also reflects and reduces the desired unintentional emissions from the component or IC specimen from propagating back into the RF Amp 230 and being attenuated there, thus maintaining a higher level of signal strength propagating into the Receive Hardware Chain 205. The power output level of the RF amp 230 may be adjustable as some parts' unintentional emission response at differing power levels at differing frequency may vary greatly. The frequency of the Signal Gen 235 and filters 225 and 265 may be adjustable to allow illumination at a plurality of frequencies. This allows the active illumination a flexibility in energizing the PSUT or a variety of parts tested under various frequencies or waveforms.

FIG. 2B illustrates a receive chain 205 that has a multiplicity of high pass, lowpass, bandpass, or band reject filters 265. The output of the filters 265 containing low power RF unintended signal emissions 260 from the component or subcomponent is connected to the analysis unit 210. The Receive Hardware Chain 205 also serves to reject and prevent the high power fundamental frequency from the output of the RF Amp 230 used to illuminate the component or IC PSUT from propagating into the analysis unit 210 and saturating it or damaging it due to the high RF power levels present.

Figure 3:
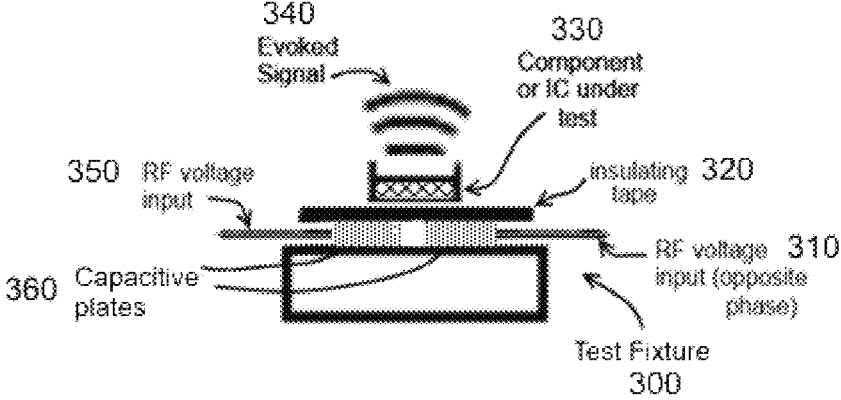
FIG. 3. is a side view of a device and test fixture using illumination from RF power introduced through capacitive coupling.

FIG. 3 is side view of a testing fixture 300 also known as the capacitive plate assembly showing capacitive plates used to induce current in the device. Its configuration typically enables the testing of any devices similarly physically dimensioned and constructed, with only signature data and illumination parameters such as frequency and power level changing between devices. Capacitive fixture assembly 300 has capacitive plates 360 mounted on the base of the assembly. The plates are preferably parallel and mounted side by side separated at a predetermined distance. Also, the plates can be at a predetermined angle. An RF input voltage line 350 is connected to the output of the transmit chain 200. A corresponding RF voltage line 310 may be out of phase with the RF input voltage line 350 such as 180 degrees out of phase or may be ground and is connected to the other capacitive plate 360. The input and output currents are of substantially opposite phase. The RF current creates an electrical field between the capacitive plates 360. The fluctuating electrical field energizes the part 330 that result in evoked RF emissions 340 from the PSUT 330. A typical RF Illumination voltage across the capacitive plates 360 is 1 Volt to 10 Volts, depending on the specifications of the PSUT, the illumination frequency, the thickness of the insulating tape, the dielectric constant of the insulating tape, and the composition of the device packaging. An empirical method is recommended to find the optimum voltage value. A 50 Ohm RF dummy load 448 may be used at the input to the integrated antenna enclosure 415 to better provide impedance matching for the RF amplifier 430.

The capacitive plates 360 may be electrically insulated from the part 330. The preferred embodiment is to cover the side of the capacitive plates 360 nearest the part with an electrically insulating tape 320, preferably an adhesive electrically insulating tape 320. The PSUT 330 is received by the test fixture 300 generally near or adjacent to the insulating tape 320. The tape 320 is not always necessary, as some parts such as DIP packaged parts may be placed with their non-conducting top surface upside down on the test fixture 300 and their pins not come in electrical contact with the capacitive plates 360. This is a typical test configuration for such parts. However, the tape prevents damage to a chip if an operator inadvertently places it in the wrong orientation. Some parts have rounded pins on the side, or conductive metal plates on the top surface necessitating the tape to prevent electrical contact with the plates 360. When energized by the field generated by the capacitive plates 360, the PSUT 360 emits an unintended RF emission analog signal 340.

Figure 4:
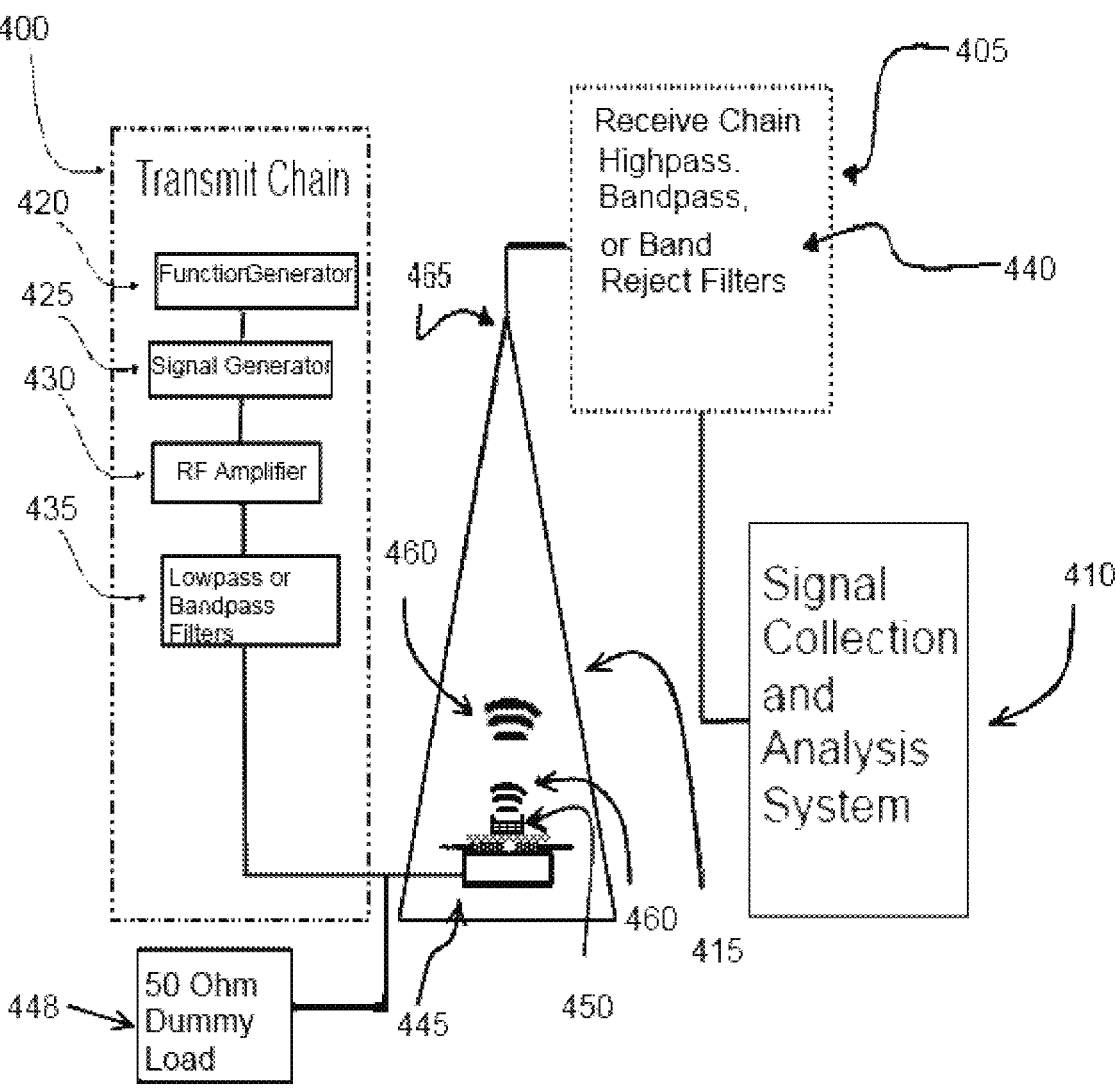
FIG. 4 is a diagram of an active illumination system with analysis system using illumination from RF power introduced thru capacitive coupling.

FIG. 4 is a block diagram of an embodiment of active illumination of a device. The device is comprised of the transmit chain 400, an integrated antenna enclosure, 415, a receive hardware chain, 405, and a signal analysis device, 410.

The transmit chain, 400, has a function generator 420, that is connected to a signal generator 425, that is connected to an RF amplifier 430 that is connected to one or more filters 435. Preferably the one or more filters 435 are one or a combination of a low pass, high pass, and bandpass filters.

The output of one or more filters 435 are connected to capacitive plates 445. The capacitive plates 445 are preferably arranged as shown in FIG. 3 in capacitive plate assembly 300. The capacitive plate assembly 300 is within the integrated antenna enclosure, 415. The capacitive plates 445 energize the PSUT 450, which causes electromagnetic emission 460, that is captured by the integrated antenna enclosure 415.

The receive chain 405 has one or more filters 440. Preferably the one or more filters are one or more of a high pass, lowpass, bandpass, and band-reject filters. A signal analyzer 410 is connected to the output of filters 440. The receiver and signal analyzer 410 are also referred to as the RF Receiver and Analyzer Unit 410. The receiver is preferably a sensitive RF receiver with a sensitivity of −170 dBm.

The signal collection and analysis system 410 is connected to the receive chain. The signal collection and analysis system has a signature analyzer spectrum analyzer, processing unit to compare spectrum metrics to acquired spectrums, and a memory unit for storage of a signature database. A spectrum analyzer is one type of signature analyzer as used in this application. In another embodiment the memory unit retains the acquired spectrum. The signature database contains information on spectrum metrics are a suite of metrics such as peak frequency separation, peak location distribution, peak frequency and amplitude separation distance, degree of curve fit, and spectrum shape. The spectrum of an uncompromised part, component or subcomponent is initially acquired and a signature database file is created that resides on the memory unit. The advantage is that the spectrum metrics allow for examination and comparison of exemplary parts with test PSUTs on multiple frequency bands and multiple spectrum features for purposes of comparison.

FIG. 5A shows an embodiment 500 with the perspective view having an inverted view or upside down view, that is the surface shown with capacitive plates 505 is facing down on the test fixture 300. The test fixture is not shown, while capacitive plates 505 are shown. The embodiment 500 has the PSUT 520 generally near or adjacent to the capacitive plates 505 which are near each other but separated by a predetermined distance. The capacitive plates 505 have input wires 510 that carry RF AC voltage that capacitively couples to the PSUT 520. This is the sole source of power to energize the PSUT 520.

In FIG. 5B, an embodiment 525 has the PSUT near or adjacent to capacitive plates 540. Capacitive plates 540, are used for both stimulation and as antennas while selected PSUT chip pin or pins 530 may be grounded with wires 535. This may drastically change the current path through the chip, exercising its circuitry in a different manner.

The wired connection to the capacitive plates 540 is not shown in FIG. 5B. In this embodiment 525 the pins 530 may be connected to ground the part 520 by wires 535 in order to alter the electrical activity of the PSUT 520. A tomography plate 545 is used for additional spectrum acquisition functioning as an additional antenna input to be analyzed or for additional RF illumination tomography of the PSUT. The tomography plate 545 may be connected to an additional separate Transmit Chain 400 to selectively illuminate a specific region of the PSUT adjacent or under it. The additional separate Transmit Chain 400 may illuminate at the same frequency as the capacitive plates 540, at the same frequency but a different phase as the Plates 540 such as 90 degrees out of phase or 180 degrees out of phase, an additional separate Transmit Chain 400 may illuminate at a different frequency, as the capacitive plates 540. The additional separate Transmit Chain 400 may illuminate at a swept frequency range or illuminate with a non-sinusoidal waveform, or a multiple frequency sinusoid-based composite waveform. An additional separate Transmit Chain 400 may illuminate with complex signals from an Arbitrary Waveform Generator, including random or pseudo-random white noise. The tomography plate 545 is fixed or movable, manually or automatically at location 550. Multiple tomography plates 545 as fixed or movable and separately performing as illumination or performing as antennas may also be employed and is envisioned herein. An additional separate Transmit Chain 400 may also illuminate the PSUT at varied power levels while the tomography plate 545 is stationary or moving. The tomography plate 545 may be attached to a x,y,z linear position encoder to determine its current position, or may be positioned at an x,y,z coordinate location manually or with a linear motion encoder. The motion or position of the tomography plate 545 may be coordinated with an illumination of the tomography plate 545 if the tomography plate 545 is used for illumination, or the motion or position of the tomography plate 545 may be coordinated with additional spectrum acquisition into a receive chain 405 and Signal Collection and Analysis System 410 and functioning as an additional antenna input 465 to be analyzed. Thus, the illumination of the PSUT vs. location or the spectrum acquisition of the PSUT vs. location may be performed.

The tomography plate 545 may share the RF illumination signal with capacitive plates 540 using a splitter such as a 2-way RF splitter. The tomography plate 545 may share the Signal Collection and Analysis System 410 using splitter such as a 2-way RF splitter.

FIG. 5C shows an embodiment 555 where the pins 530 of the PSUT 575 may be connected to one or a plurality of wires 570 on one or a plurality of pins 530 for grounding, for supplying power, for supplying control voltages to change chip operational state, for supplying commands to the chip such as SPI bus commands, for supplying test voltages such as analog voltages into an ADC, or for taking additional measurements such as time domain voltage measurements. The capacitive plates 560 are connected by wires 565 to the RF power input from the transmission chain as shown in FIG. 4 and also may be connected to the receive chain 405 RF input cable 465 which is typically a 50 ohm coaxial cable.

The difference between this embodiment 555 and the embodiment 525 in FIG. 5B is that the embodiment 555 has a view of the orientation of the PSUT 575 from the top of the PSUT 575, as positioned upside down in the test fixture. In FIG. 5B, the embodiment 525 has the view orientation of the part 520 pins are shown in a normal configuration with the PSUT upside down on the test fixture as is typical in normal use. The capacitive plates 560 that are used to energize the PSUT 575 can be used to receive induced electromagnetic emissions from the PSUT 575 and input into receive chain 405. A capacitive plate 560 may be used for additional spectrum acquisition functioning as an additional antenna input to be analyzed or for additional RF illumination tomography of the PSUT.

FIG. 5D shows an embodiment 580 where multiple smaller regional capacitive plates 590 are connected to the transmission chain by 585. The multiple capacitive plates 590 are controlled separately to energize different regions of the PSUT 520. The capacitive plates 590 can be selectively operated. Each connected capacitive plate 590 can receive independent or dependently controlled AC signals 585. One or more of capacitive plate 590 may be connected to an Arbitrary Signal Generator for capacitively coupling voltages into specific regions and influencing the chip circuitry with additional complex stimuli. The advantage of this embodiment is that there is a high likelihood of emission spectra content to include non-harmonically related spectral elements that can provide additional information regarding part functionality. Additionally, some of the capacitive plates 590 may alternatively serve as antennas for added unintended emission inputs instead of active illumination plates.

Figure 6B:
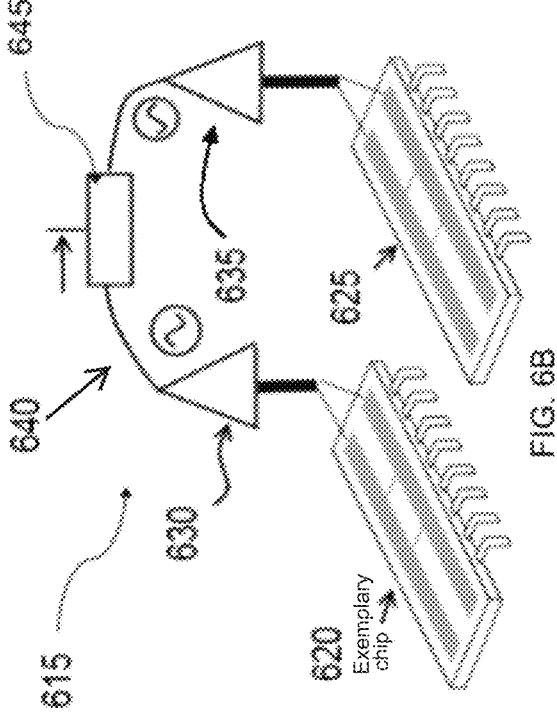
FIG. 6B is a perspective view of a test fixture and two-PSUT, an exemplary known good specimen and a test PSUT with an amplifier and inverted amplifier with a combined output.
Figure 6A:
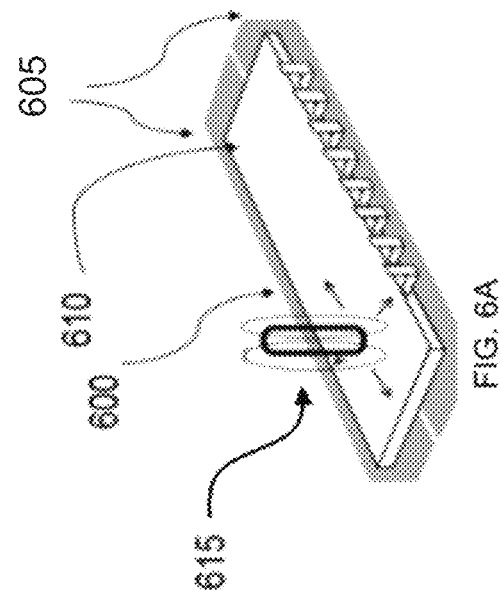
FIG. 6A is a perspective view of a test fixture and PSUT with a ferrite core.

FIG. 6A is an embodiment 600, a ferrite core 615 focuses inductive RF illumination from the underside of the PSUT 610, the underside of the PSUT not generally adjacent to the illumination plates 605, to induce currents that influence interconnect line currents and traces within the chip inductively, separately from an or any capacitive-based current generation. The ferrite core 615 may be connected to the output of an illumination transmit chain 400. The ferrite core 615 induces additional RF input to regions of the PSUT 610 using H-Field coupling which differs from the capacitive coupling resulting from the capacitive plates 605 or the one or more locally positioned capacitive plates 545. Each connected ferrite core 615 can receive independent or dependently controlled AC signals 585. One or more of ferrite cores 615 may be connected to an Arbitrary Signal Generator for capacitively coupling voltages into specific regions and influencing the chip circuitry with additional complex stimuli. The advantage of this embodiment is that there is a high likelihood of emission spectra content to include non-harmonically related spectral elements that can provide additional information regarding part functionality.

FIG. 6B is an embodiment 640 which shows a substantially out of phase received signal from exemplary PSUT 620, and a test PSUT 625 causing some elements of the received signal to cancel out. This serves to cancel out signals in common and allow signal differences arising from part differences to be more clearly seen. Using an inverting amplifier 635 to invert the phase 180 degrees from the exemplary PSUT 620, the part's 625 signal is combined with the exemplary part's 620 signal, to cancel or substantially reduce common features, lowering the noise floor, and making algorithmic analysis of spectrum metric differences more apparent with a higher signal to noise ratio. Preferably, this embodiment has two separate Low Noise Amplifiers and antennas in the receive chains. One of the LNAs being an inverting amplifier 635 and the other 630 not. The exemplary part 620 and the part 625 may be illuminated from one or more sets of capacitive plates. The resulting single output signal 640 is propagated to the receive hardware chain. In this embodiment, the illuminating capacitive plates may be both connected to the RF output from transmit chain 400 and used as antennas to receive the unintended emissions by also being connected to the Receive chain 405. An embodiment wherein the capacitive plates both illuminate with RF and act as antennas rely on the transmit chain filter 435 and receive chain 405 filters to create the needed low dBm level unintended emissions without passing the high dBm level RF illumination power into the Signal Analysis and Collection system 410.

Figure 7:
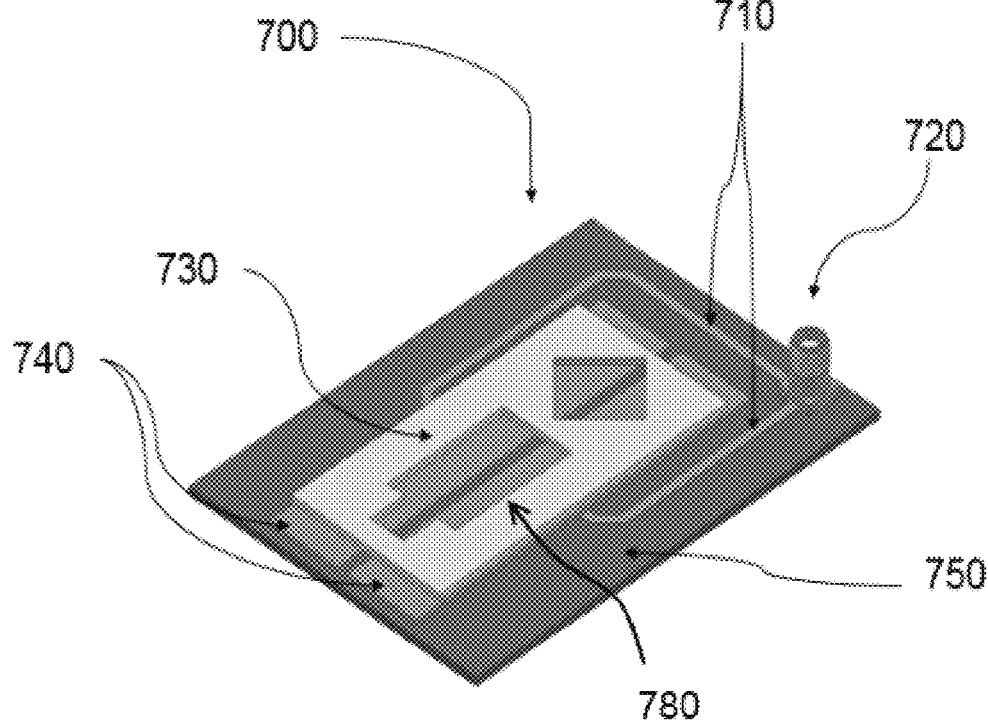
FIG. 7 is a partial perspective view of a test fixture.

FIG. 7 is an embodiment of the RF capacitive coupling device test fixture. A printed circuit board 750 is populated with an input connector 720, leads 710 from the input connector 720 comprising ground and RF leads, and two capacitive plates 740. An insulating guide plate 730, is positioned on top of the capacitive plates 740, to receive and register PSUTs during measurement. The insulating guide plate 730 and the capacitive plate 740 form a 2-layer test fixture. The insulating guide plate 730 has a cavity to receive the PSUT. This cavity allows for the PSUT to be spatially registered in a consistent position relative to the capacitive plates increasing the consistency of test results. The insulating guide plate 730 can be configured for one specific device package or configured, as shown, to accommodate multiple device packages. A cutout region 780 may be used to register a PSUT in a Dual in-line package (DIP) accurately. The cutout region 780 accommodating both a narrow and wide DIP package is shown therein.

FIG. 8A shows the method of active illumination to induce current flow. Step 800 induces active illumination of the PSUT at the selected frequency or frequencies and RF power level or Power levels for that PSUT. The illumination frequency, power level, and waveform are selectable according to the part geometry and properties. The illumination frequency, power level, and waveform can be provided to the PSUT in a wide range of combinations. The optimal combination is determined when the exemplary part is measured for algorithmic solutions to signature metrics used by the system. These illumination parameters are dependent on the nominal operating condition of the PSUT, as well as the geometry of the package type used by the PSUT. These illumination parameters are specified by the signature database (DB) and provided to the RF transmit chain, or can be manually input to the RF transmit chain. The signature database also provides one or more frequencies, frequency spans, RBWs, signal processing parameters, algorithms to use for each region of interest (ROI), algorithmic parameters to be used in emission spectra analysis, and probability density functions (PDFs) of the set of one or more exemplary parts.

Step 810 is the acquisition of the emission signature by the analysis unit. The frequency domain RF signature is captured in one or more ROIs (Regions Of Interest) with unique RF metric content as specified by the signature database file for the unique PSUT.

Step 820 compiles a metric dataset from the algorithms and algorithmic solutions specified in the signature database file. The algorithms specified by the signature database file are analyzed using the parameters specified by the signature database file on a ROI by ROI basis. The resulting algorithmic solutions are compiled for each acquisition into an aggregate for each ROI.

Step 830 determines PDFs of the PSUT based on the compiled algorithmic solutions aggregated in step 820. The kernel density estimator determines the PDF for each emission signature metric in each frequency ROI.

Step 840 performs a comparative analysis. The comparative analysis compares the metric PDF between the one or more exemplary parts and the PSUT for result analysis. Typically, a broadening of the PDF for a given metric, i.e. increased standard deviation, indicates reduced reliability as there is increased variability in the part's operation. A shift in the PDF mean or median indicates that there is a change in the part's performance or behavior. A change in shape of the PDF typically indicates that the metric is multi-modal, and the emission spectra has more than one preferred emission signature.

Typically, Step 810 is performed for a set number of acquisitions or for a set duration of time. This can be modified by user input to the analysis unit. Multiple measurements are used to raise the signal to noise ratio by combining the acquired signals and to increase statistical certainty.

The repeated step 810 can be done a fixed number of times, can be arranged to repeat the measurement for a fixed period of time, or repeated until a certainty threshold has been reached, which is especially applicable for borderline parts.

FIG. 8B shows the method of creating an exemplary PDF for one or more exemplary PSUTs. Step 850 consists of one or more of steps to identify optimum illumination power, frequency, and/or other test parameters, acquire spectral emission signatures from one or more exemplary PSUTs, the identify of ROIs for signature metric analysis, identify metrics to apply to the emission spectral signature in the identified ROIs, optimize algorithmic parameters for identified metric analysis, creating one or more files to save hardware and/or software parameters, and/or propagating one or more hardware and/or software parameter files to the signal analyzer memory. Step 850 can be performed one or more times to optimize hardware and/or software parameters for the set of one or more exemplary PSUTs. Step 850 will be performed for each unique part type, for example for each microelectronic device with a unique National Stock Number (NSN).

Step 860 shows the method of extracting a PSUT metric database. Step 860 consists of one or more steps to collect multiple spectral emission signature acquisitions for each ROI identified in step 850 from one or more exemplary PSUTs, determination of the algorithmic solution for each acquisition for each identified metric, compilation of aggregated algorithmic solutions for each identified metric, and/or compilation of statistical parameters of aggregated algorithmic solutions for each identified metric. Multiple acquisitions of the spectral emission signature for each ROI is required for reliable statistical analysis. Typically, a minimum of thirty (30) acquisitions are required for reliable analysis.

Step 870 shows the method of determining the exemplary part probability density functions for each metric identified for each ROI identified in step 850. Step 870 consist of one or more of steps to statistically analyze the aggregated algorithmic solutions for each identified metric for each ROI identified in step 850. The statistical analysis can include one or more of the parameters of mean, median, standard deviation, amplitude, curve fitting parameters, and/or shape of the distribution.

Step 880 shows the method of saving the exemplary PSUT PDF to the signature database on the signal analyzer memory. Step 880 consists of propagating one or more files containing PDFs, aggregated algorithmic solutions of one or more metrics, and/or characteristic statistical classifiers of aggregated algorithmic solutions of one or more metrics to the memory of the signal analyzer.

Although specific advantages have been enumerated above, various embodiments may include some, none, or all of the enumerated advantages. Other technical advantages may become readily apparent to one of ordinary skill in the art after review of the following figures and description. It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Unless otherwise specifically noted, articles depicted in the drawings are not necessarily drawn to scale.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

We claim:

1. A testing fixture for testing a microelectronic part specimen under test (PSUT), the testing fixture comprising:
   at least one capacitive member having two capacitive plates;
   radio frequency (RF) voltage supplies of opposite phases connected to each capacitive plate; and
   an insulating guide plate positioned above the two capacitive plates, the insulating guide plate including a cavity, the cavity configured to receive a part specimen under test (PSUT), the insulating guide plate being further configured to spatially register the PSUT in a position relative to the two capacitive plates.

2. The testing fixture of claim 1, wherein the testing fixture has more than one capacitive member.

3. The testing fixture of claim 1, wherein the two capacitive plates are positioned at a predetermined angle to each other.

4. The testing fixture of claim 1, wherein the two capacitive plates comprise two generally flat plates positioned at a predetermined distance from each other and a predetermined angle relative to each other, with alternating current (AC) voltage supplies of opposite phase connected to each plate.

5. The testing fixture of claim 1, wherein the two capacitive plates define a lower layer and wherein the insulating guide plate defines an upper layer.

6. A testing fixture, comprising:
   a printed circuit board;
   an input connector with leads mounted on a surface of the printed circuit board;
   a first layer positioned on the surface of the printed circuit board and connected to the leads; and
   a second layer positioned above the first layer, the second layer including an insulating guide plate with at least one cut-out.

7. The testing fixture of claim 6, wherein the first layer comprises two capacitive plates disposed at a distance from each other.

8. The testing fixture of claim 7, further comprising radio frequency (RF) voltage supplies of opposite phase connected to two capacitive plates.

9. The testing fixture of claim 6, wherein the at least one cut-out being configured to accommodate a narrow dual in-line package (DIP).

10. The testing fixture of claim 6, wherein the at least one cut-out being configured to accommodate a wide dual in-line package (DIP).

11. The testing fixture of claim 6, wherein, the insulating guide plate configured to spatially register a part specimen under test (PSUT) in a position relative to the first layer.

12. The testing fixture of claim 6, wherein the leads comprise ground and radio frequency (RF) leads.

13. A testing fixture, comprising:
   a printed circuit board;
   an input connector mounted on the printed circuit board;
   ground and radio frequency (RF) leads connected to and extending from the input connector;
   two capacitive plates positioned, at a distance from each other, on the printed circuit board, the two capacitive plates being connected to ground and RF leads; and
   an insulating guide plate positioned above the two capacitive plates, the insulating guide plate including a cavity, the cavity configured to receive a part specimen under test (PSUT) and spatially register the PSUT in a position relative to the two capacitive plates.

14. The testing fixture of claim 13, further comprising RF voltage supplies of opposite phase connected to two capacitive plates.

15. The testing fixture of claim 13, wherein the ground and radio frequency (RF) leads and the two capacitive plates being disposed on same surface.

* * * * *